(12) United States Patent
Kropewnicki et al.

(10) Patent No.: US 6,440,864 B1
(45) Date of Patent: Aug. 27, 2002

(54) SUBSTRATE CLEANING PROCESS

(75) Inventors: Thomas J. Kropewnicki, Foster City; Jeremiah T. Pender, San Jose; Henry Fong, Daly City, all of CA (US); Charles Peter Auglis, Plano, TX (US); Raymond Hung, San Jose; Hongqing Shan, Cupertino, both of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/607,822

(22) Filed: Jun. 30, 2000

(51) Int. Cl.$^7$ .................................................. H01L 21/00
(52) U.S. Cl. .................... 438/710; 134/1.2; 216/67; 438/725
(58) Field of Search .................. 134/1.1, 1.2, 1.3, 134/2, 31; 216/67; 438/710, 725

(56) References Cited

U.S. PATENT DOCUMENTS

| | | | |
|---|---|---|---|
| 4,325,984 A | 4/1982 | Galfo et al. | |
| RE32,928 E | 5/1989 | Jacob | |
| 4,863,561 A | 9/1989 | Freeman et al. | |
| 4,877,757 A | 10/1989 | York et al. | |
| 4,911,812 A | 3/1990 | Kudo et al. | |
| 4,961,820 A | 10/1990 | Shinagawa et al. | |
| 4,983,254 A | 1/1991 | Fujimura et al. | |
| 5,007,981 A | 4/1991 | Kawasaki et al. | |
| 5,024,748 A | 6/1991 | Fujimura | |
| 5,039,376 A | 8/1991 | Zukotynski et al. | |
| 5,102,496 A | 4/1992 | Savas | |
| 5,134,089 A | 7/1992 | Barden et al. | |
| 5,160,407 A | 11/1992 | Latchford et al. | |
| 5,174,856 A | 12/1992 | Hwang et al. | |
| 5,198,634 A | 3/1993 | Mattson et al. | |
| 5,200,031 A | 4/1993 | Latchford et al. | |
| 5,221,424 A | 6/1993 | Rhoades | |
| 5,221,425 A | 6/1993 | Blanchard et al. | |
| 5,228,950 A | 7/1993 | Webb et al. | |
| 5,240,555 A | 8/1993 | Kilburn | |
| 5,262,279 A | 11/1993 | Tsang et al. | |
| 5,280,359 A | 1/1994 | Mimura et al. | |
| 5,298,112 A | 3/1994 | Hayasaka et al. | |
| 5,306,671 A | 4/1994 | Ogawa et al. | |
| 5,328,555 A | 7/1994 | Gupta | |
| 5,356,478 A | 10/1994 | Chen et al. | |
| 5,378,311 A | 1/1995 | Nagayama et al. | |
| 5,382,316 A | 1/1995 | Hills et al. | |
| 5,384,009 A | 1/1995 | Mak et al. | |
| 5,397,432 A | 3/1995 | Konna et al. | |

(List continued on next page.)

FOREIGN PATENT DOCUMENTS

| | | |
|---|---|---|
| EP | 0304046 | 8/1988 |
| EP | 0345757 | 6/1989 |
| EP | 0663690 | 6/1989 |
| EP | 0379301 | 1/1990 |

(List continued on next page.)

OTHER PUBLICATIONS

Battey, James F., "The reduction of Photoresist Stripping Rates in an Oxygen Plasma by By–product Inhibition and Thermal Mass", *J. Electrochem. Soc.: Solid–State Science and Technology*, 124(1): 147–152 (Jan. 1977).

(List continued on next page.)

*Primary Examiner*—William A. Powell
(74) *Attorney, Agent, or Firm*—Janah And Associates; Joseph Bach

(57) ABSTRACT

A substrate cleaning method comprises exposing a substrate 30 to an energized process gas to remove residue 60 and resist material 50 from the substrate 30. In one version, the process gas comprises cleaning gas, such as an oxygen-containing gas, and an additive gas, such as $NH_3$. In one version, the process gas is introduced to remove residue 60 and resist material 50 from the substrate and to remove residue from surfaces in the process chamber 75.

46 Claims, 5 Drawing Sheets

U.S. PATENT DOCUMENTS

| | | |
|---|---|---|
| 5,399,236 A | 3/1995 | Ha et al. |
| 5,403,436 A | 4/1995 | Fujimura et al. |
| 5,413,950 A | 5/1995 | Chen et al. |
| 5,413,954 A | 5/1995 | Aydil et al. |
| 5,417,826 A | 5/1995 | Blalock |
| 5,425,843 A | 6/1995 | Saul et al. |
| 5,449,411 A | 9/1995 | Fukuda et al. |
| 5,451,293 A | 9/1995 | Tabara |
| 5,460,999 A | 10/1995 | Hong et al. |
| 5,468,686 A | 11/1995 | Kawamoto |
| 5,478,403 A | 12/1995 | Shinagawa et al. |
| 5,514,247 A | 5/1996 | Shan et al. |
| 5,545,289 A | 8/1996 | Chen et al. |
| 5,560,803 A | 10/1996 | Yachi |
| 5,578,163 A | 11/1996 | Yachi |
| 5,620,559 A | 4/1997 | Kikuchi |
| 5,628,871 A | 5/1997 | Shinagawa |
| 5,674,357 A | 10/1997 | Sun et al. |
| 5,681,780 A | 10/1997 | Mihara et al. |
| 5,693,147 A | 12/1997 | Ward et al. |
| 5,773,201 A | 6/1998 | Fujimara et al. |
| 5,780,359 A | 7/1998 | Brown et al. |
| 5,814,155 A | 9/1998 | Solis et al. |
| 5,824,604 A | 10/1998 | Bar-Gadda |
| 5,849,639 A | 12/1998 | Molloy et al. |
| 5,858,878 A | 1/1999 | Toda |
| 5,968,275 A | 10/1999 | Lee et al. |
| 5,980,768 A | 11/1999 | Abraham |
| 6,080,529 A * | 6/2000 | Ye et al. ......... 430/313 X |
| 6,105,588 A * | 8/2000 | Li et al. ......... 438/725 X |

FOREIGN PATENT DOCUMENTS

| | | |
|---|---|---|
| EP | 0416774 | 8/1990 |
| EP | 0489179 | 6/1991 |
| GB | 2008464 | 11/1978 |
| JP | 1175231 | 12/1987 |
| JP | 63070428 | 3/1988 |
| JP | 1112734 | 1/1989 |
| JP | 6448421 | 2/1989 |
| JP | 0341728 | 7/1989 |
| JP | 1227160 | 9/1989 |
| JP | 4171918 | 11/1990 |
| JP | 3110843 | 10/1991 |

OTHER PUBLICATIONS

Fujimura, S., et al., "Resist Stripping in an $O_2 + H_2O$ Plasma Downstream," *J. Vac. Sci. Technol.* B9(2):357–361 (Mar./Apr. 1991).

Fujimura, S., et al., "Additive Nitrogen Effects on Oxygen Plasma Downstream Ashing," *Japanese Journal of Applied Physics*, 29(10):2165–2170, Part 1, (Oct. 1990).

Gas Plasma Systems Bulletin No. 73/79 entitled, "DIONEX™ Stripping Wafers with Plasma" (4 pages).

Pender et al., "CD Control and Residue REmoval During Wafer Stripping After Dielectric Etches", Abstract from 196th Electrochemical Society Meeting, Oct. 22, 1999.

* cited by examiner

SUBSTRATE CLEANING PROCESS

BACKGROUND

The present invention relates to cleaning a substrate.

In the manufacture of integrated circuits, active devices are formed on a substrate by alternately depositing and etching layers of dielectric, semiconducting, and conducting materials, such as silicon dioxide, polysilicon, and metal compounds and alloys. These layers are etched to form a pattern of etched features, by providing a resist layer of photoresist and/or oxide hard mask on the substrate and using lithography, for example, to expose and pattern the resist layer. The portions of the layers adjacent to the patterned resist features are etched to form a predefined pattern of gates, vias, contact holes, trenches, and/or metal interconnect lines. Etching is typically performed using a capacitively or inductively coupled plasma of halogen-containing gases, as for example described in *Silicon Processing for the VLSI Era,* Vol. 1, Chapter 16, by Wolf and Tauber, Lattice Press, 1986, which is incorporated herein by reference in its entirety.

After the etching process, etchant residue and remnant resist material that remain on the substrate are removed prior to processing of the next layer on the substrate. The etchant residues formed during the etching processes are typically complex compositions that condense from the vaporized plasma environment onto the freshly etched features and other surfaces of the substrate. The composition of the etchant residue depends upon the composition of the etching gas, the vaporized species of the layer that is being etched, and the composition of the organic resist or hard mask layer that is sputtered or etched away by energetic plasma ions. Vias are plugs of conducting material that electrically connect to a metal interconnect line underlying the dielectric layer. Vias are formed by etching a hole or void into the dielectric layer, and subsequently filling the hole with a conducting material.

One method of cleaning or removing the residue material is a dry cleaning method in which a plasma of a gas, such as oxygen is used to burn off the residue material remaining on the substrate. However, conventional dry clean methods often (i) do not remove sufficient amounts of residue from the substrate, (ii) require extended processing times that decrease process throughput, and/or (iii) can etch into underlying layers on the substrate. Thus, the etchant residue is typically removed by a wet cleaning process in which the substrate is scrubbed in a heated solvent (for example EKC 265, commercially available from Shipley, Co., Newton, Mass.) to dissolve accumulated etchant residue. However, the wet cleaning process often requires a solvent that is costly and hazardous to the environment. Moreover, transferring the substrate from the etching process chamber to a wet cleaning station may lower yields from the substrate if the substrate is contaminated in the transferring operation. Furthermore, exposure of the freshly etched metal features to the atmosphere during transport of the substrate between the different processing stations can oxidize contact/junction points, providing high electrical contact resistances, which are undesirable.

Thus, there is a need to be able to clean a substrate to, for example, remove remnant resist and etchant residue on a substrate. It is further desirable to clean a substrate without damaging the substrate. It is still further desirable to clean a substrate without compromising process throughput.

SUMMARY

The present invention satisfies these needs. In one aspect of the present invention a substrate cleaning method comprises exposing a substrate to an energized process gas to remove residue and resist material from the substrate, the process gas comprising cleaning gas and an additive gas comprising $NH_3$.

In another aspect of the invention, a substrate processing method comprises providing a substrate having a dielectric material, exposing the substrate to an energized process gas comprising etchant gas to etch the dielectric material, exposing a substrate to an energized process gas to remove residue and resist material from the substrate, the process gas comprising cleaning gas and an additive gas comprising $NH_3$.

In another aspect of the invention, a method of removing etchant residue or resist material on a substrate comprises exposing the substrate to an energized process gas comprising cleaning gas and $NH_3$ to remove a majority of the etchant residue or resist material.

In another aspect of the invention, a substrate cleaning method comprises exposing a substrate to an energized process gas to remove residue and resist material from the substrate, the process gas comprising cleaning gas. The method also comprises applying a bias to the substrate.

In another aspect of the invention, a substrate cleaning method comprises providing a substrate in a process chamber, and providing an energized process gas comprising cleaning gas in the process chamber to remove residue from the surfaces in the chamber and to remove residue and resist material from the substrate.

In another aspect of the invention, a substrate cleaning method comprises providing a substrate in a process chamber, and providing an energized process gas comprising cleaning gas and a nitrogen-containing gas to remove residue from the substrate and from the surfaces in the chamber, wherein the volumetric flow ratio of nitrogen-containing gas to cleaning gas is less than about 1:1.

In another aspect of the invention, a substrate processing method comprises providing a substrate having a dielectric material in a chamber, providing an energized etchant gas in the chamber to etch the dielectric material, thereby forming etchant residue, and providing an energized process gas to remove etchant residue and resist material from the substrate and to remove etchant residue from surfaces of the chamber, the process gas comprising cleaning gas and an additive gas comprising $NH_3$.

DRAWINGS

These features, aspects, and advantages of the present invention will become better understood with regard to the following description, appended claims, and accompanying drawings which illustrate exemplary features of the invention. However, it should be understood that each of the features can be used in the invention in general, not merely in the context of the particular drawings, and the invention includes any combination of these features, where:

DESCRIPTION

The process and apparatus of the present invention are useful for processing substrates, such as semiconductor wafers, but may also be used for other processes or for processing other substrates, such as printed circuit boards, flat panel displays, and liquid crystal displays. Thus, the description represents illustrative embodiments of the invention and is not intended to limit the invention.

Figure 1A:
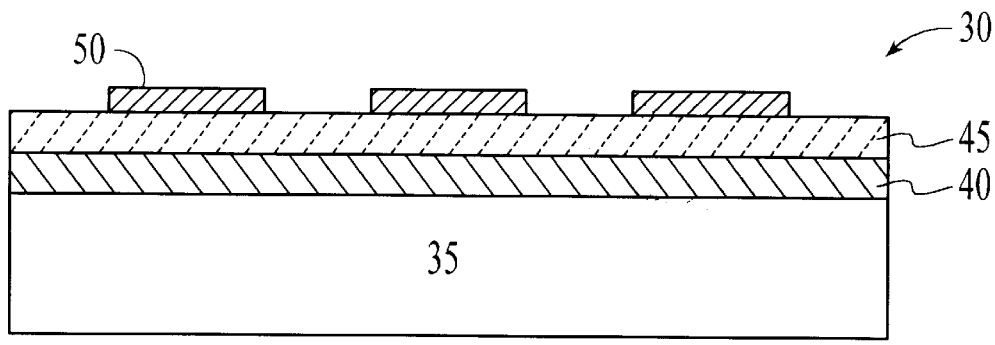
FIGS. 1a through 1c are schematic sectional side views of a version of a substrate that may be processed according the present invention.

In one version of the present invention, a substrate 30, such as a substratum 35 having one or more materials, such as layers 40, 45, thereon as shown in FIG. 1a, may be processed. These layers are often superimposed on one another and may comprise dielectric layers comprising, for example, silicon dioxide, undoped silicate glass, phosphosilicate glass (PSG), borophosphosilicate glass (BPSG), $Si_3N_4$, or TEOS deposited glass; semiconducting layers comprising, for example, silicon-containing layers such as polysilicon or a silicon compound; and electrically conducting layers such as metal-containing layers comprising, for example, aluminum, copper, or metal silicide such as tungsten silicide and cobalt silicide. Suitable etchant gases for etching layers on the substrate 30, include for example, HCl, $BCl_3$, HBr, $Br_2$, $Cl_2$, $CCl_4$, $SiCl_4$, $SF_6$, $F_2$, $NF_3$, HF, $CF_3$, $CF_4$, $CH_3F$, $CHF_3$, $C_2H_4F_2$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers or materials that are being etched. When multiple layers are sequentially etched, multiple etchant gas compositions having first, second, third, etc. compositions may be sequentially introduced into the chamber to etch each particular layer.

Figure 1B:
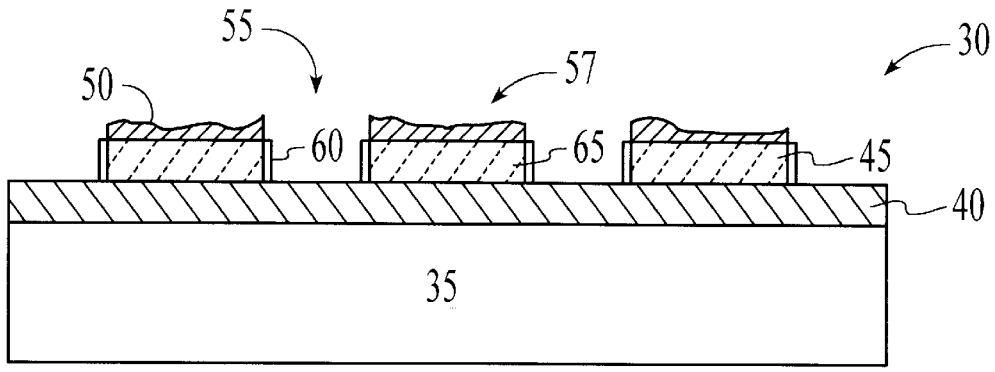
Figure 1C:
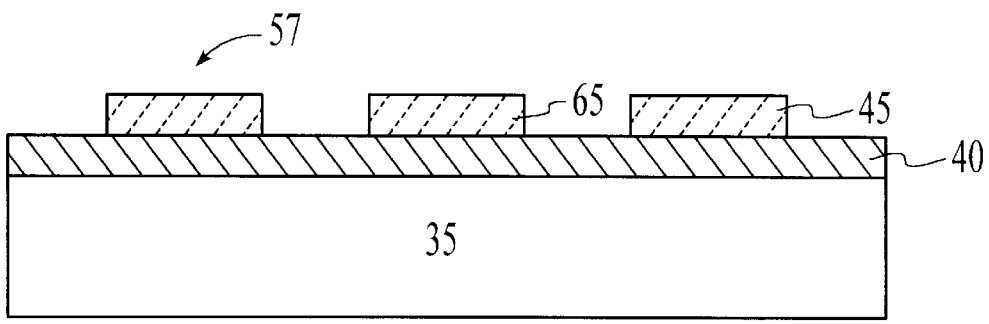

FIG. 1a shows a substrate 30 comprising multiple layers which may be processed in accordance with the present invention. A substratum 35, such as a wafer comprising silicon or gallium arsenide which may have doped regions, supports a metal-containing layer 40 covered by a dielectric layer 45. Patterned etch-resistant resist material 50 overlies the dielectric layer 45. In an etching process, exposed regions of the dielectric material 45 are etched by etchant gas to form apertures, such as trenches, holes or vias 55, that extend through the dielectric layer 45 to the contact junction points in the underlying metal layer 40, as schematically illustrated in FIGS. 1b. During the etching process, etchant residue 60 comprising complex compositions of the vaporized or gaseous species in the activated etchant gas are deposited on the surface and sidewalls 65 of the etched features 57 on the substrate 30. After the etching process, the etchant residue 60 along with remnant resist material 50 remaining on the substrate 30 must be removed to provide a clean substrate surface, as shown in FIG. 1c, for subsequent processing steps.

Figure 2:
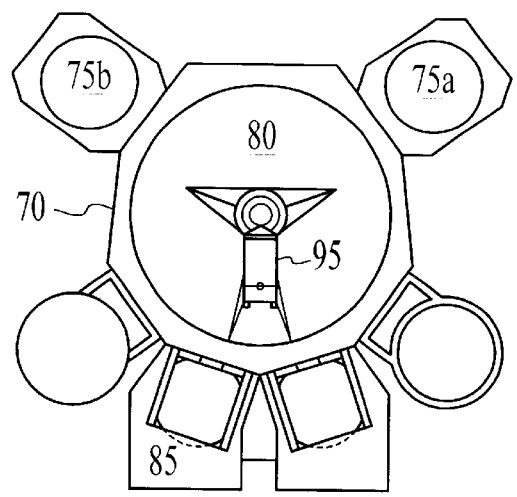
FIG. 2 is a schematic top sectional view of a multi-chamber apparatus having multiple processing chambers.

Referring to FIG. 2, in accordance with the present invention, the substrate 30 is processed, in a multi-chamber apparatus 70 comprising multiple process chambers 75a, 75b for series or parallel processing of one or more substrates 30. For example, the chambers may include an etching chamber for etching the substrate 30, and a cleaning chamber for removing etchant residue 60 and remnant resist 50 that remains on the substrate 30 after the etching process. The processing chambers 75a, 75b, a transfer chamber 80, and a load lock chamber 85 may be interconnected in a vacuum sealed environment that is maintained at a low pressure to reduce contamination of the substrate 30. An advantage of the multichamber apparatus 70 is that different chambers may be used for different purposes in the entire process. For example, one chamber may be used for etching a substrate, another for the deposition of a conductive material, another may be used for rapid thermal processing, and yet another may be used for depositing an anti-reflective layer. The process may proceed uninterrupted within the multichamber apparatus 70, thereby preventing contamination of wafers that may otherwise occur when transferring wafers between various separate individual chambers (not in a multichamber system) for different parts of a process.

Figure 3:
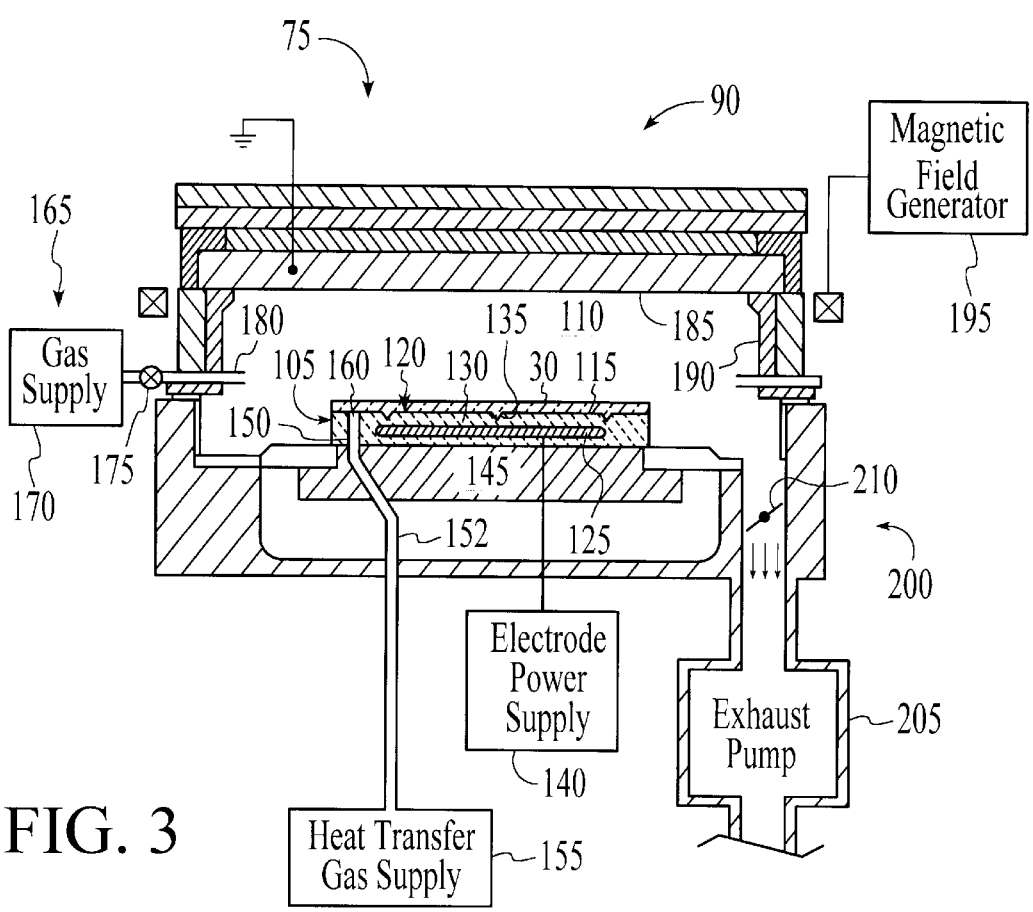
FIG. 3 is a schematic sectional side view of a version of a process chamber.

One exemplary process chamber 75 is illustrated in FIG. 3. In one version, the chamber 75 may be, for example, an a Super e, or eMAX (TM's) chamber commercially available from Applied Materials Inc. in Santa Clara, Calif. The chamber 75, shown in FIG. 3, is merely an example of a chamber that may be used to process a substrate and that may be used as one or more of the chambers in the multichamber apparatus 70. The chamber 75 may be used to process a substrate 30, such as etch a dielectric layer 45 or remove etchant residue 60 and remnant resist 50 that remains on the substrate 30 after an etching process. To perform a process according to the present invention, a substrate 30 is transferred from the load lock 85, to the transfer chamber 80, and then to the chamber 75 by a robotic arm 95. The substrate 30 is placed on a support 105 in a process zone 110 of the chamber 75, the support 105 having a substrate receiving surface 115. In one version of the chamber 75, the support 105 may comprise an electrostatic chuck 120 to hold the substrate 30 in place during the processing of the substrate 30. The electrostatic chuck 120 may comprise an electrode 125 at least partially covered by a dielectric 130. The electrostatic chuck 120 may also be provided with grooves 135 in which a heat transfer gas, such as helium, is held to control the temperature of the substrate 30. The electrode 125, which may be a single conductor or a plurality of conductors, is chargeable to electrostatically hold the substrate 30. After the substrate 30 is placed on the chuck 120, the electrode 125 is electrically biased with respect to the substrate 30 by an electrode power supply 140 to electrostatically hold the substrate 30. A base 145 below the electrostatic chuck 120 supports the chuck, and optionally, is also electrically biased with an RF bias voltage.

Heat transfer gas may be provided during processing of the substrate 30 to the interface between the substrate 30 and the dielectric 130 of the chuck 120, to enhance heat transfer rates therebetween. The heat transfer gas is provided via gas conduits 150 that extend through one or more of the electrode 125 and dielectric layer 130. A heat transfer gas supply 155 supplies heat transfer gas to the conduits 150 via a gas supply channel 152. The conduits 150 have one or more outlets 160 that deliver the gas to the surface 115 of the chuck 120. The substrate 30 may cover the edges of the dielectric 130 to reduce leakage of heat transfer gas from the edge of the chuck 120. The grooves 135 on the surface 115 of the dielectric 130 are sized and distributed to hold heat transfer gas to heat or cool substantially the entire backside of the substrate 30, such as for example, a pattern of intersecting grooves 135 radiating across the dielectric 130. The heat transfer gas may comprise helium or argon which may be supplied at a pressure of about 5 to about 30 Torr; however, other gases such as $CF_4$ can also be used.

Energized process gas is provided in the process zone 110 to process the substrate 30. Process gas is introduced into the chamber 75 through a gas supply system 165 that includes a gas supply 170, a control valve 175, and one or more gas nozzles 180 extending into the chamber 75 about the support 105. Alternatively, the gas supply system 165 may comprise a showerhead on or near the ceiling 185 of the chamber 75. The gas in the chamber 75 is typically maintained at a low pressure, such as from about 1 to about 1000 mTorr, and more typically from 1 to 400 mTorr. An electric field can be maintained in the process zone 110 to form an energized process gas by, for example, (i) applying a RF current to an inductor coil (not shown) encircling the etching chamber 75 to inductively couple energy to the gas, (ii) applying a RF voltage to cathode and anode electrodes in the chamber 75 to capacitively couple energy to the gas, or (iii) both inductively and capacitively coupling energy to the gas in the process zone 110. By "energized process gas" it is meant that the process gas is activated or energized to form one or more dissociated species, non-dissociated species, ionic species, and neutral species. In the version shown in FIG. 3, the process gas is capacitively energized by applying an RF voltage to the electrode 125 in the support 105 which serves as the cathode electrode and by electrically grounding the ceiling 185 or sidewalls 190 of the chamber 75 to form an anode. The process gas may be energized by applying a RF voltage from the electrode power supply 140 at a power level of from about 100 to about 2000 Watts at a frequency of typically from about 50 KHz to about 60 MHz, and more typically about 13.56 MHz.

The energized process gas can also be enhanced by electron cyclotron resonance in a magnetically enhanced reactor. In one version, a magnetic field generator 195, such as a permanent magnet or electromagnetic coils, provides a magnetic field that may increase the density and uniformity of the energized process gas in the process zone 110. Preferably, the magnetic field comprises a rotating magnetic field with the axis of the field rotating parallel to the plane of the substrate 30, as described in U.S. Pat. No. 4,842,683 which is incorporated herein by reference in its entirety.

Spent process gas and process byproducts are exhausted from the chamber 75 through an exhaust system 200 comprising one or more roughing pumps and turbomolecular pumps 205 and which is capable of achieving a minimum pressure of about $10^{-3}$ mTorr in the chamber 75. Typically, a throttle valve 210 is provided in the exhaust for controlling the pressure in the chamber 75.

After completion of processing, the substrate 30 is dechucked using suitable dechucking means. For example, a pneumatic lifting apparatus (not shown) which raises lift pins in the support 105 to raise the substrate 30 from the surface of the support. The robotic transport arm 95 is inserted between the substrate and the chuck 120 to lift the substrate 30 off the lift pins. Thereafter, the lift pins are retracted into the chuck 120, and the robotic arm 95 transports the substrate 30 out of the chamber 75 and into the transfer chamber 95.

In one version, a substrate 30 may be etched in the chamber 75 by exposing the substrate 30 to energized process gas comprising etchant gas in the process zone 100. To etch, for example, the dielectric material 45 on the substrate 30, the etchant gas may comprise gases introduced under process conditions selected to selectively etch the dielectric material 45 at a high etch rate. A dielectric layer 45 composed of, for example, silicon oxide, silicon nitride, or a polymeric dielectric material such as polyimide or BCB (benzocyclobutene), may be etched in etchant gas comprising halogen-containing gas, such as a fluorocarbon gas. The process gas may also comprise, for example, oxygen-containing gas which may control, such as by enhancing or inhibiting, formation of passivating deposits, if desired, and/or a carrier gas, such as nitrogen to affect the degree of passivation, for example. In addition, an inert gas can be added to the etchant gas to provide sputtering ions that sputter and remove material from the substrate 30. In one version, the etchant gas comprises one or more halogen-containing gases, such as $CF_4$, and a carrier or inert gas, such as $N_2$, and optionally an oxygen-containing gas, such as $O_2$, in a volumetric ratio that efficiently etches apertures in the dielectric material 45 to contact junction points in an underlying metal layer 40.

After the etching process, etchant residues 60 on the surfaces of the etched features 57 on the substrate 30 and/or remnant resist material 50 may be removed in a cleaning process. The etchant residues 60 may comprise a polymeric or amorphous composition of species such as carbon or hydrogen species, as well as other species such as hydrocarbon, oxygen or nitrogen species. In the etching of silicon-containing layers, such as silicon dioxide layers, the etchant residue 60 may also contain vaporized silicon-containing species that originate from the silicon, polysilicon, or silicon dioxide layer. When the underlying metal layer 40 is partially etched, the etchant residue 60 may also includes vaporized metal species, such as aluminum, titanium, copper, or mixtures thereof. The etchant residue 60 forms on sidewalls 65 of etched features 55 and serves as an inhibitor or passivator layer that prevents excessive etching through the sidewalls 55 of the freshly etched features and enhances anisotropic etching by stopping etching in the direction parallel to the plane of the substrate 30.

To remove the etchant residue 60 and remnant resist 50, the substrate 30 may be transferred from one chamber 75a to another chamber 75b in the multichamber apparatus 70. In one version, the cleaning process may be performed in a process chamber 75 such as the process chamber illustrated in FIG. 2. Since other cleaning chambers can also be used to remove etchant residue 60 or strip remnant resist 50 from the substrate 30, the cleaning process may alternatively be performed, for example, in an ASP chamber commercially available from Applied Materials, Inc., which energizes gas in a remote plasma generation zone in a remote chamber and which is described in commonly assigned and currently pending U.S. patent application Ser. No. 09/595,336, to Chun Yan et al. and entitled "Substrate Cleaning Apparatus and Method" which was filed on Jun. 14, 2000 and which is incorporated herein by reference in its entirety. In another version, the substrate 60 may be etched and cleaned in the same process chamber 75.

During cleaning, the substrate 30 is placed on the support 105 in the process zone 110 and exposed to energized process gas comprising cleaning gas. Heat transfer fluid may be circulated to maintain the substrate 30 at a desired temperature. Process gas comprising cleaning gas is introduced by gas supply system 165 and energized in the process zone 110 to remove etchant byproducts 60 and remnant resist 50 on the substrate 30. In one version, the cleaning gas may comprise (i) one or more oxygen-containing gases, such as one or more of $O_2$, $H_2O$, $O_3$ and He—$O_2$, and optionally (ii) an additive gas, such as one or more of $N_2$, $NH_3$, $CF_4$, $C_2F_6$, $CHF_3$, $C_3H_2F_6$, $C_2H_4F_2$, or $CH_3F$. The cleaning gas may serve to both strip (or ash) remnant resist 50 and to remove etchant residue 60 from the substrate 30. A single cleaning step may be performed or multiple cleaning steps may be performed, as discussed in U.S. Pat. No. 5,545,289, which is incorporated herein by reference in its entirety.

In one particular version, the process gas comprises a cleaning gas, such as a cleaning gas comprising oxygen-containing gas, and an additive gas comprising a nitrogen and hydrogen species, such as $NH_3$. It has been discovered that the addition of $NH_3$ to an oxygen-containing cleaning gas can significantly increase the cleaning rate and the cleaning ability of the cleaning gas. Cleaning gas with $NH_3$ containing additive gas has been shown to effectively remove substantially all of the remnant resist 50 and etchant residue 60 from the substrate 60 in less time than an oxygen-containing gas alone. Furthermore, in processing some types of substrates 30, a cleaning gas comprising $O_2$ alone is ineffective in removing substantially all of the residue 60, even over extended periods of time, whereas the cleaning gas with $NH_3$ containing additive is effective is removing substantially all of the residue. It has been further discovered that excessive amounts of $NH_3$ addition can adversely affect the cleaning rate. This is believed to be due to a reduced oxygen-containing gas flow or to excessive nitrogen species resulting in the etchant residue 60 becoming nitrated, thereby becoming more difficult to remove. In one version, the volumetric flow ratio of $NH_3$ gas to oxygen-containing gas, for example $O_2$, is less than about 1:1, preferably from about 1:100 to about 1:4, more preferably from about 1:50 to about 1:7, even more preferably from about 1:20 to about 1:9, and most preferably about 1:19, under process conditions of about 80 mTorr to about 100 mTorr pressure, about 250 watts to about 400 watts, about 15° C. to about 20° C. with a volumetric process gas flow of about 250 sccm to about 500 sccm, more preferably about 350 sccm. Exposing the substrate 30 to the energized cleaning gas comprising oxygen-containing gas and $NH_3$ gas for from about 30 seconds to about 60 seconds has been determined to effectively clean the substrate 30. The process gas may further comprise carrier or inert gases or one or more of the cleaning or additive gases discussed above.

The cleaning process may be performed in one or more steps. For example, the energized process gas may be introduced under first process conditions for a first period of time and under second process conditions for a second period of time. It may be advantageous in cleaning some types of substrates 30 to provide a more aggressive first step and a less aggressive second step. The aggressiveness 30 may be altered by changing process conditions, such as power levels, process gas flow rates, and process gas compositions. In one version, a majority of the etchant residue 60 and/or the remnant resist 50 is removed using a process gas comprising cleaning gas, such as oxygen-containing gas, and $NH_3$. Lesser amounts of residue or resist can be removed before and/or after the majority removal. In another version, substantially all of the residue 60 and remnant resist 50 may be removed using an energized process gas comprising cleaning gas, such as oxygen-containing gas, and $NH_3$.

Figure 4A:
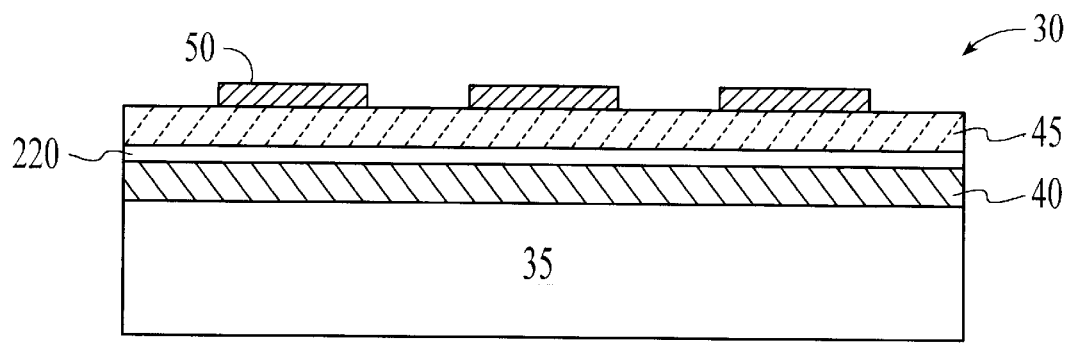
FIGS. 4a through 4c are schematic sectional side views of another version of a substrate that may be processed according the present invention.
Figure 4B:
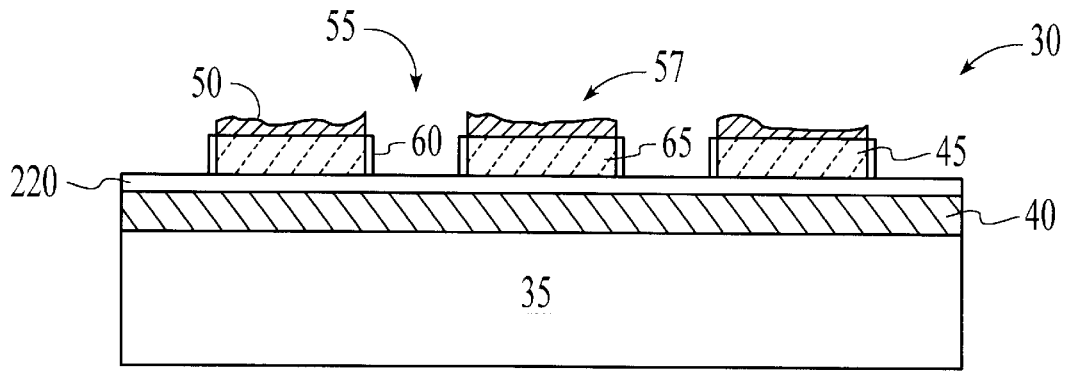

FIG. 4a shows another substrate 30 comprising multiple layers which may be processed in accordance with the present invention. The substrate 30 of FIG. 4a is similar to the substrate 30 of FIG. 1a. However, the dielectric material 45 on the substrate of FIG. 4a comprises a low K dielectric material. In addition, a barrier layer 220, comprising for example $Si_3N_4$, SiON, SiC, TEOS or TiN, or the like, is provided between the low K dielectric and the metal layer 40. In one version, the low K dielectric 45 comprises an organic polymer material, such as benzocyclobutene, parleying, polytetrafluoroethylene, polyether, polyimide, or mixtures thereof, having a low dielectric constant, such as a dielectric constant less than about 3.2, and more preferably, less than about 3.0. The low K dielectric 45 may comprise an organic polymer material having a low dielectric constant, and including small amounts of other materials to provide increased thermal stability and/or adhesion to a variety of metals and oxides. For example, the low K dielectric 45 may comprise a silicon-containing organic polymer material having a low dielectric constant, such as benzocyclobutene polymer or organosilicate glass. By silicon-containing it is meant that the organic polymer material contains elemental silicon or silicon compounds, such as Si, $SiO_2$, or $Si_3N_4$. The low K dielectric 45 may comprise commercially available low K materials, such as Silk (TM), available from Dow Chemical Corporation, Black Diamond (TM), available from Applied Materials, Inc., or non-polymeric low K dielectrics, such as ceramic low K dielectric material.

A suitable low K dielectric material 45 comprising an organic polymer material may be fabricated from high viscosity fluids consisting essentially of an organic polymer-precursor suspended in a solvent base. For example, CYCLOTENE® manufactured by Dow Chemical Company comprises the organic polymer benzocyclobutene, which has a dielectric constant of about 2.4 and is suspended in a solvent. The fluid polymer-precursor is applied on a substrate 30 using a conventional spin coating apparatus, and optionally heat treated, to form a low K dielectric 45 comprising an organic polymer. The thickness of the low K dielectric 45 is adjusted by varying the volumetric flow rate at which polymer dispensed on the substrate 30, the speed at which the substrate 30 is spun, or the spinning time. The polymer layer on the substrate 30 is then cured in a vacuum oven and a low pressure and/or high temperature to evaporate the solvent carrier and cross-link the polymer.

Figure 4C:
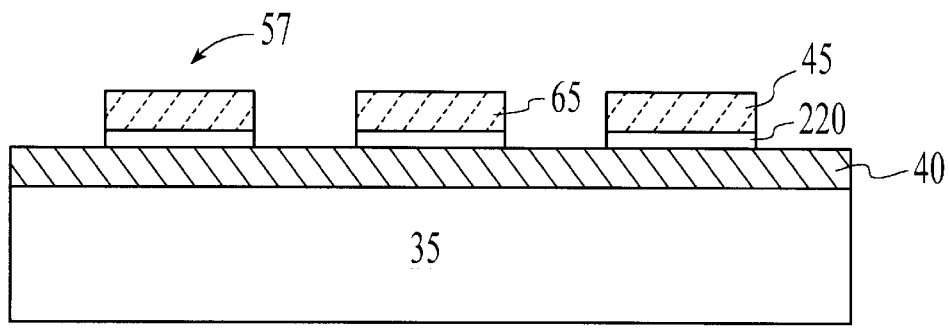

To etch a substrate having a low K dielectric 45, such as shown in FIG. 4a, the substrate is exposed to process gas in a process zone 110 of a process chamber 75, such as the chamber shown in FIG. 2. The process gas may comprise etchant gas that provides high etch rate and a high etching selectivity ratio of low K dielectric 45. For example, in one version, the etchant gas may comprise one or more of $C_2F_6$, $O_2$, $N_2$, CO, and $CHF_3$. Although the precise mechanism of the etching is unknown, it is believed the etching occurs primarily by the reaction of the etchant gas with the components of the low K dielectric 45 to form gaseous carbon compounds that are exhausted from the process chamber 75. This results in the formation of etched features 57 with apertures 55 in the low K dielectric material 45. As with the etching of the substrate 30 of FIGS. 1a–1c, etchant residue 60 is deposited on the surface and sidewalls 65 of etched features 57 on the substrate 30. After the etching process, the etchant residue 60 along with any remnant resist material 50 remaining on the substrate 30 must be removed to provide a clean substrate surface for subsequent processing steps. In addition, it is desirable to remove the barrier layer 220, to leave a clean substrate 30 and to expose the underlying metal layer 40, as shown in FIG. 4c.

It has been discovered that process gas comprising cleaning gas comprising $NH_3$ is unexpectedly effective in removing etchant residue 60 resulting from the etching of low K dielectric material 45, particularly carbon-containing low K dielectric materials. The low K dielectric etchant residue 60 is often composed of fluorine rich polymeric material that is difficult to clean in an energized process gas comprising oxygen-containing gas without additive gas. In addition, it has been discovered that cleaning gas comprising oxygen-containing gas can result in residue formation during resist removal. These residues may cause problems during subsequent processing steps, such as trench patterning after a via etch or metalization of an etched structure. By adding $NH_3$ to the cleaning gas, however, the formation of these additional residues is substantially avoided. Moreover, the addition of $NH_3$ provides an increased cleaning rate and/or increased cleaning ability. For example, it has been determined that a substrate 60 comprising low K dielectric etchant residue 60 is often not cleaned, even after extended exposure, when using an oxygen-containing energized process gas without $NH_3$ containing additive. However, by adding $NH_3$ to the cleaning gas, the required time can be reduced to about 60 seconds, and in many cases can be reduced to about 30 seconds or less. Although the exact mechanism is not known, it is believed that the $NH_3$ provides for the scavenging of free fluorine by hydrogen. The substrate 60 is sufficiently cleaned by the addition of $NH_3$ to maintain via critical dimension control and not cause additional roughening of the surfaces.

Furthermore, it has been discovered that the barrier layer 220 can be removed from the substrate 30 in the process chamber 75 used to clean the substrate 30. The barrier layer removal process may, in one version involve providing an energized process gas comprising one or more of $CH_3F$, $CH_2F_2$, $O_2$, and $N_2$. It may be necessary to remove the barrier layer in a chamber 75 that is substantially absent polymeric residue because species, such as fluorine, in the residue may be liberated during the cleaning process and adversely affect the process, such as by attacking the dielectric material 45 and/or the barrier layer 220. In addition, excess residue can result in residue deposition on the metal layer 40 when the barrier layer 220 is being removed. By adding $NH_3$ to the cleaning gas during the removal of etchant residue 60 and remnant resist 50, sufficient residue is removed to prevent the unwanted attack, thereby allowing the barrier layer 220 to be removed without transferring the substrate 60 to a separate chamber. This significantly increases throughput and provides additional space in the multichamber apparatus 70 for parallel processing.

In another version of the invention, process throughput may be increased by etching a substrate 30 and removing etchant residue 60 and remnant resist 50 in the same process zone 110. By using a single chamber 75 to perform both processing steps, the throughput is increased by avoiding transfer and evacuation time. In addition, by removing the need for two separate chambers, space is provided for another etching chamber, thereby allowing for parallel processing of substrates and even further increasing process throughput. The substrate 30 is exposed to an energized process gas comprising etchant gas in a chamber 75, and thereafter, the substrate 30 is exposed to an energized process gas comprising cleaning gas to simultaneously remove etchant residue 60 and remnant resist 50 from the substrate and remove etchant residue from surfaces in the chamber. These surfaces may include the surfaces of walls of the chamber 75 and the surfaces of components within or near the chamber 75. In one version, the cleaning gas comprises oxygen-containing gas, such as $O_2$ The process conditions and exposure times are selected to allow the oxygen-containing cleaning gas to remove polymeric residues, for example, from the chamber surfaces and from the substrate 30 and/or to remove polymeric photoresist, for example, from the substrate 30.

Figure 5:
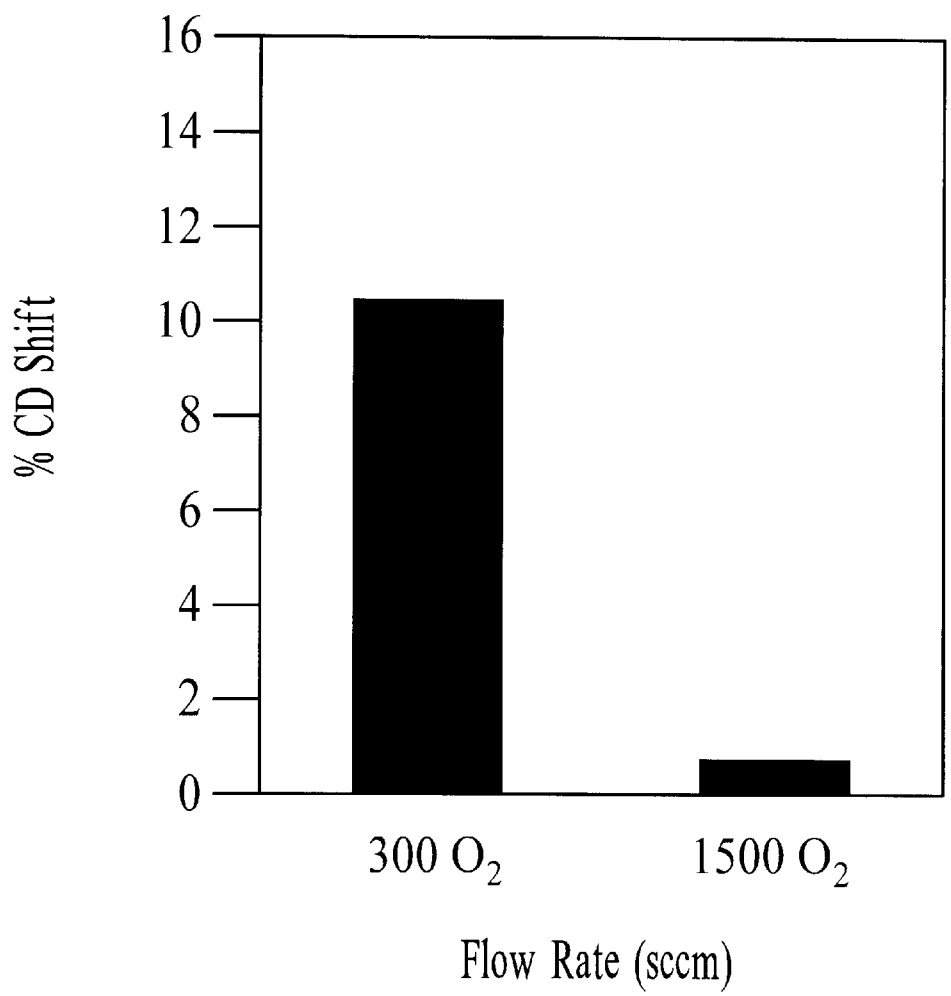
FIG. 5 is a graph showing the effect of cleaning gas flow on the percent critical dimension shift in the processing of a substrate.

It has been discovered that high flow rates of oxygen-containing gas during the cleaning process can result in improved substrate processing, particularly when cleaning substrates etched in highly polymerizing chemistries. For example, high $O_2$ flow rates have been determined to decrease cleaning time and, unexpectedly, reduce critical dimension loss. FIG. 5 shows the results of relatively low $O_2$ flows and relatively high $O_2$ flows in cleaning an experimental substrate. The experiment was designed to exaggerate critical dimension shift by exposing the substrate to extremely long etches using very highly polymerizing chemistries. As can be seen, the high $O_2$ flow rate results in a significantly reduced critical dimension shift. It is believed that etchant residues, such as polymeric residues, formed on the chamber roof and walls can affect the critical dimension control. Optical emission spectroscopy was used to confirm that fluorine is released from polymer residue as it is cleaned from the chamber surfaces and from the substrate 30. It is believed that the fluorine attacks material, such as oxide, on the substrate surface, and impacts the final critical dimension control. It has also been discovered that the etchant residues on the chamber surfaces has a greater impact on critical dimension control than residue on the sidewalls 65 or on the resist 50. In another experiment, it has been discovered that critical dimension control is not lost when a substrate 30 is cleaned in a chamber 75 that does not have etchant residues, such as polymeric residue, on the chamber surfaces, thereby substantiating the belief that the etchant residue on the chamber surfaces is primarily responsible for the loss in critical dimension control. Thus, it is believed that high $O_2$ flow rates reduces critical dimension control loss by limiting the fluorine residence time in the process zone 110.

Accordingly, in one version of the present invention, residue 60 and remnant resist 50 are removed from a substrate 30 and surfaces of a chamber 75 are simultaneously cleaned, in situ, by introducing process gas comprising cleaning gas at a high flow rate into the chamber 75. The volumetric flow rate of oxygen-containing gas, such as $O_2$ in the cleaning gas is at least about 100 sccm. More preferably, particularly when cleaning substrates 30 etched in highly polymerizing chemistries and when cleaning substrates highly susceptible to post etch processing difficulties, such as substrates 30 comprising low K dielectric material 45, the volumetric flow rate of oxygen-containing gas, such as $O_2$, in the cleaning gas is at least about 200 sccm, more preferably from about 500 sccm to about 2000 sccm, and most preferably about 900 sccm, with a source power of about 2400 watts and a pressure of about 30 mTorr.

In another version, the in situ cleaning gas further comprises an additive gas. It has been discovered that some polymeric residues may remain on some types of substrate after being cleaned in a cleaning gas comprising oxygen-containing gas absent an additive gas. Remaining residues can adversely affect post etch processing of some types of substrates. For example, some materials, such as oxides, may be attacked by removed residue, critical dimension control can be compromised, and additional residue may formed on the substrate 30. Accordingly, the cleaning gas may further comprise an additive gas selected to facilitate removal of substantially all of the residues 60 and remnant resist 60 on the substrate 30.

For example, it has been discovered that additions of hydrogen-containing and/or fluorine-containing gas improves the residue 60 and remnant resist 50 removal. The addition of fluorine-containing gas, such as one or more of $CF_4$, $C_2F_6$, $C_4F_8$, and $CHF_3$, has been discovered to be particularly effective in removing excess residue. Therefore, in one version of the invention, $CF_4$ is added at a volumetric flow rate of about 5 sccm to about 20 sccm. Preferably, the volumetric flow ratio of fluorine-containing gas to oxygen-containing gas is from about 1:100 to about 1:1, preferably from about 1:100 to about 1:10. When cleaning a substrate 30 having materials, such as oxides, susceptible to etch by the fluorine-containing gas, however, the addition of fluorine-containing gas should be carefully controlled to avoid undesired etching of the material. In these cases, the volumetric flow ratio of the fluorine-containing gas to the oxygen-containing gas is from about 1:100 to about 1:20. The addition of hydrogen-containing gas, such as $H_2$, $CH_4$, and $CH_3F$, has also been determined to improve residue 60 and remnant resist 50 removal from the substrate 30. Thus, the addition of an additive gas to a cleaning gas comprising an oxygen-containing gas improves the processing of some types of substrates 30.

In another version, the additive gas additionally or alternatively comprises $NH_3$ gas. $NH_3$ additive gas does not introduce additional carbon into the chamber 75 and therefore does not contribute to additional polymerization in the chamber 75. In addition the $NH_3$ gas reduces the exposure time necessary for residue removal and provides for the scavenging of free fluorine, as discussed above. Thus, the addition of $NH_3$ gas to a cleaning gas introduced to simultaneously remove etchant residue 60 and remnant resist 50 and remove residue from chamber surfaces allows for increased residue removal from the substrate and prevents material, such as oxide, loss from the substrate.

In another version, a bias can be applied to the substrate 30 to remove residue 60 and remnant resist 50 from the substrate 30. For example, a bias of from about 75 watts to about 500 watts for a period of about 10 seconds to about 20 seconds has been discovered to improve substrate cleaning. It is believed that the bias application helps to break up polymeric residue on the substrate, making the residue more susceptible to cleaning during the cleaning process. Although bias application in itself improves residue removal, the combination of bias application and the addition of fluorine, such as 10 sccm of $C_2F_6$, is effective in removing residue formation or preventing additional residue formation, particularly in substrates absent exposed oxides. Additionally, $NH_3$ containing additive gas further improves the cleaning process.

Figure 6:
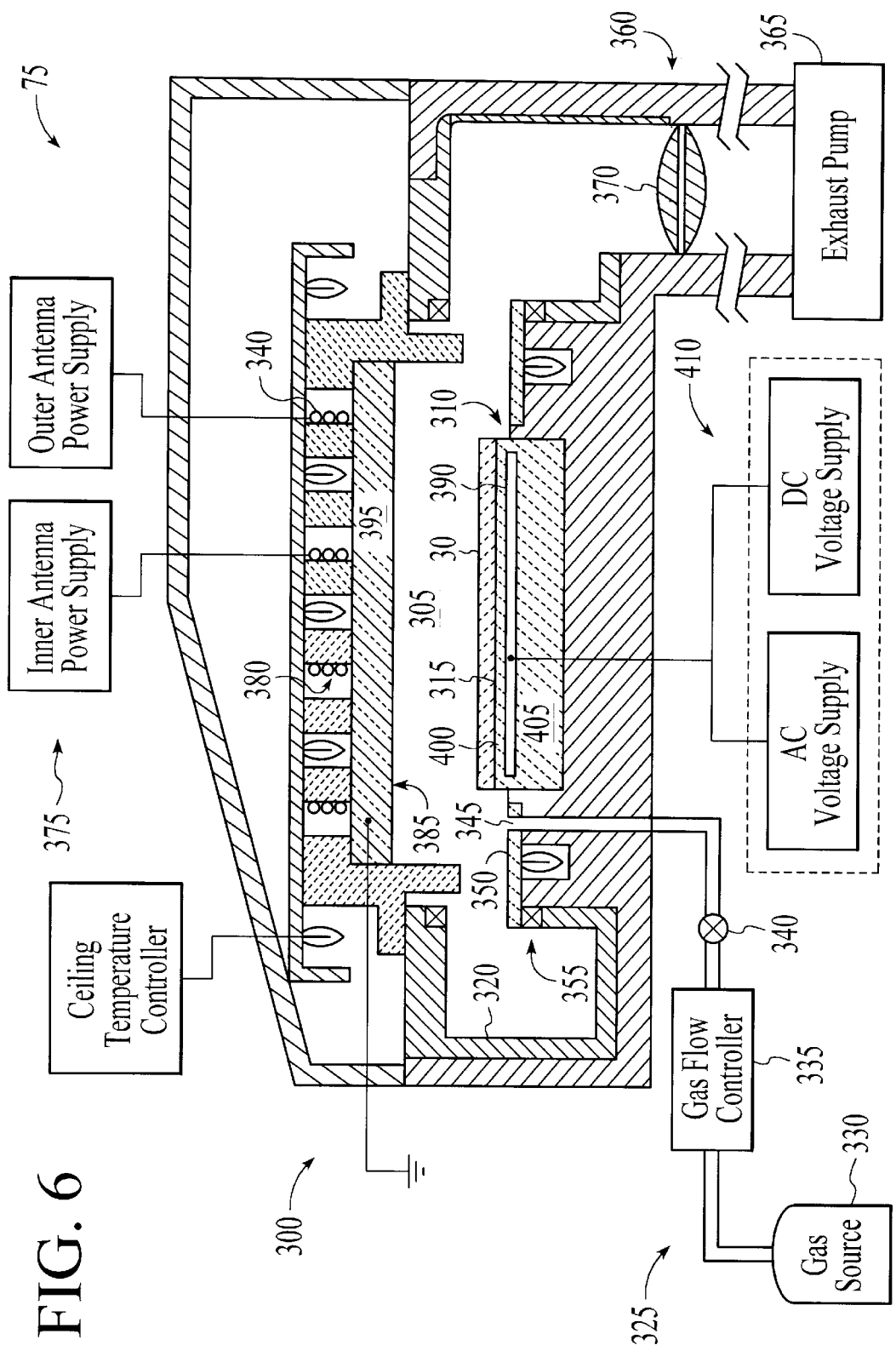
FIG. 6 is a schematic sectional side view of another version of a process chamber.

Another chamber 75 effective in both etching a dielectric material 45 and removing etchant residue 60 and remnant resist 50 is an IPS Chamber, commercially available from Applied Materials, Inc. in Santa Clara, Calif. and shown schematically in FIG. 6. The particular embodiment of the chamber 75 shown herein is suitable for processing of substrates 30, such as semiconductor or glass wafers, and may be adapted to process other substrates 30, such as flat panel display, polymer panels, or other electrical circuit receiving structures. The apparatus of FIG. 6 is provided only to illustrate the invention and should not be used to limit the scope of the invention or its equivalents to the exemplary embodiments provided herein. The apparatus of FIG. 6 is preferably attached to a mainframe unit that contains and provides electrical, plumbing, and other support functions for the chamber 75. Exemplary mainframe units compatible with the illustrative embodiment of the chamber 75 are commercially available as the Centura systems from Applied Materials, Inc., of Santa Clara, Calif. The multichamber system has the capability to transfer a wafer between its chambers without breaking the vacuum and without exposing the wafer to moisture or other contaminants outside the multichamber system.

The chamber 75 comprises an enclosed process chamber 300 defining a process zone 305 for processing the substrate 30, and a support 310 having a receiving surface 315 for holding the substrate 30 during processing. The load-lock transfer area 80 is maintained at low pressure for holding a cassette of substrates.

The enclosed chamber 300 has walls 320 fabricated from a metal, ceramic, glass, polymer, or composite material, of which anodized aluminum is preferred, and which may have a surrounding liner. The process zone 305 of the enclosed process chamber 300 is above and around the substrate 30 and typically comprises a volume of at least about 10,000 $cm^3$, and more typically from about 10,000 $cm^3$ to about 50,000 $cm^3$. The particular embodiment of the chamber 75 shown in FIG. 6 is suitable for processing of semiconductor substrates, is provided only to illustrate the invention, and should not be used to limit the scope of the invention.

Process gas is introduced into the chamber 75 by a gas supply 325 that includes a gas source 330 and a gas flow controller 335 that regulates the gas flow through one or more gas flow control valves 340. The gas is provided in the enclosed chamber 300 via gas nozzles 345 located at or around the periphery of the substrate 30 (as shown), or which may be provided in a showerhead on the ceiling of the chamber (not shown). In one version, the gas is introduced through a ring 350 that is maintained at a temperature of from about 250° C. to about 400° C. Preferably, the ring 350 is made of silicon and comprises a passageway (not shown) for providing the process gas about the periphery of the substrate 30. The ring 350 is temperature controlled using an optical pyrometer for feedback, an array of lamps 355 below the ring 350 to heat the ring 350, and by conduction cooling through the bottom wall of the enclosed chamber 300. The ring 350 may also serve as a controlled source of silicon for scavenging free fluorine ions and radicals from the process environment.

Spent process gas and etchant byproducts are exhausted from the enclosed process chamber 300 through an exhaust system 360 (typically including roughing and high vacuum-type exhaust pumps 365) capable of achieving a minimum pressure of about $10^{-3}$ mTorr in the enclosed chamber 300. A throttle valve 370 is provided in the exhaust to control the flow of spent process gas and the pressure of process gas in the enclosed chamber 300.

The process gas may be energized using a gas energizer 375 that couples an electromagnetic energy into the gas in the process zone 305 of the enclosed chamber 300. In one version, the gas energizer 375 comprises an antenna 380 adjacent to the ceiling 385 consisting of one or more coils 390 having a circular symmetry with a central axis coincident with the longitudinal vertical axis that extends through the enclosed process chamber 300. The ceiling 385 is made of material which admits electromagnetic fields generated by the antenna 380 into the process zone 305. This material may be a dielectric or as described below a semiconductor. The frequency of the RF voltage applied to the antenna 380 is typically from about 50 KHz to about 60 MHz, and more typically about 2 MHz, and the power level of RF voltage applied to the antenna 380 is typically from about 100 to about 5000 Watts.

Additionally or alternatively, the gas energizer 375 may comprise one or more process electrodes 390, 395 that may be used to accelerate or energize the energized gas ions in the enclosed chamber 300. For example, the process electrodes may include a first electrode 395 comprising a wall of the process chamber, such as the ceiling 385 of the chamber. The first electrode 395 is capacitively coupled to a second electrode 390 in the support 310 below the substrate 30. The second electrode 390 may be fabricated from a metal such as tungsten, tantalum, or molybdenum, and may be covered by or embedded in a dielectric 400. The second electrode 390 may serve as an electrostatic chuck 405 that generates an electrostatic charge for electrostatically holding the substrate 30 to the receiving surface 315 of the support 310. A heater or cooler (not shown) may also be provided below the dielectric 400 to heat or cool the overlying substrate 30 to desired temperatures.

In one version, the first electrode 395 comprises a semiconductor ceiling 385 that is sufficiently electrically conductive to be biased or grounded to form an electric field in the enclosed chamber 300 yet provides low impedance to an RF induction field transmitted by the antenna 380 above the ceiling 385. Semiconductor materials, such as silicon carbide, germanium, or Group III-V compound semiconductors such as gallium arsenide and indium phosphide, or Group II-III-V-VI compound semiconductors such as mercury-cadmium-telluride, can be employed. In one version, the ceiling 385 comprises silicon since it is less likely to be a source of contamination for processing silicon substrates, in comparison with other materials. More preferably, the semiconductor ceiling 385 comprises semiconducting silicon having a resistivity of less than about 500 $\Omega$-cm (at room temperature), and most preferably about 20 $\Omega$-cm to about 200 $\Omega$-cm. The temperature of the ceiling is typically maintained at from about 120° C. to about 200° C., and may be maintained above about 300° C.

The first and second electrodes 390, 395 are electrically biased relative to one another by the electrode voltage supply 410 that includes an AC voltage supply for providing a plasma generating RF voltage to the second electrode 390, and a DC voltage supply for providing a chucking voltage to the second electrode 390. The AC voltage supply provides an RF generating voltage having one or more frequencies from 50 KHz to 60 MHz, and preferably about 2 MHz. The power level of the RF bias current applied to the electrodes 390, 395 is typically from about 50 to about 3000 Watts. When the second electrode 390 also serves as an electrostatic chuck, a separate DC voltage is applied to the electrode 390 to form an electrostatic charge that holds the substrate 30 to the chuck 405. The RF power is coupled to a bridge circuit and an electrical filter to provide DC chucking power to the second electrode 390.

The chamber 75 may be operated by one or more controllers (not shown) that include instructions to set first process conditions to form etch-passivating deposits onto a surface of the substrate, and set second process conditions to etch the surface of the substrate. Typically, the controller comprises a computer operating a computer program containing program code embodying the process conditions. For example, the program code may comprise computer instructions to lower a bias power applied to the process electrodes after a plasma of the gas is stabilized, to set a bias power of substantially zero, or to maintain a bias power at a predetermined level and for a preset time. In addition, the program code may comprise computer instructions to maintain a flow of a gas capable of forming etch-passivating deposits on the substrate or etching the substrate, control a source power level applied to an inductor source about the process zone, or change a bias power level to another bias power level.

The chamber 75 may further comprise one or more detectors or sensors (not shown) that are used to detect, monitor continuously during an operation of the chamber 75, or monitor during a process being conducted on the substrate 30, the process conditions in the chamber 75. The detectors include, for example, but are not limited to, a radiation sensing device such as a photomultiplier or optical detection system; a gas pressure sensing device such as a pressure gauge, for example, a manometer; a temperature sensing device such as a thermocouple or RTD; ammeters and voltmeters to measure the currents and voltages applied to the chamber components; or any other device capable of measuring a process condition in the chamber 75 and providing an output signal, such as an electrical signal, that varies in relation to the measurable process condition.

Although the present invention has been described in considerable detail with regard to the preferred embodiments thereof, other embodiments are possible. For example, the order of cleaning gas and additive gas may be introduced concurrently or as bursts. Similarly, the gases may be introduced in multiple steps with varying process conditions. Also, the invention may be used in the deposition of material on a substrate, for example in CVD or PVD processes. Other modifications can be made without departing from the scope of the invention. Therefore, the appended claims should not be limited to the descriptions of the preferred embodiments contained herein.

What is claimed is:

1. A substrate cleaning method comprising:
   exposing a substrate to an energized process gas to remove residue and resist material from the substrate, the process gas comprising cleaning gas and an additive gas comprising $NH_3$; and
   applying a bias to the substrate.

2. A method according to claim 1 wherein the volumetric flow rate of the cleaning gas and additive gas are selected to remove substantially all of the residue deposited on the substrate during a previous process.

3. A method according to claim 1 wherein the cleaning gas comprises an oxygen-containing gas.

4. A method according to claim 1 wherein the cleaning gas comprises $O_2$.

5. A method according to claim 4 wherein the volumetric flow rate of $O_2$ is at least about 100 sccm.

6. A method according to claim 1 wherein the volumetric flow ratio of additive gas to cleaning gas is less than about 1:1.

7. A method according to claim 1 wherein the volumetric flow ratio of additive gas to cleaning gas is from about 1:20 to about 1:9.

8. A method according to claim 1 wherein the additive gas further comprises a fluorine-containing gas.

9. A substrate processing method comprising:
   providing a substrate having a dielectric material;
   exposing the substrate to an energized process gas comprising etchant gas to etch the dielectric material; and
   exposing a substrate to an energized process gas to remove residue and resist material from the substrate, the process gas comprising cleaning gas and an additive gas comprising $NH_3$.

10. A method according to claim 9 wherein the dielectric material comprises a low K dielectric material.

11. A method according to claim 10 wherein the low K dielectric material comprises a dielectric constant less than about 3.2.

12. A method according to claim 9 wherein the cleaning gas comprises an oxygen-containing gas.

13. A method according to claim 9 wherein the cleaning gas comprises $O_2$.

14. A method according to claim 13 wherein the volumetric flow rate of $O_2$ is at least about 100 sccm.

15. A method according to claim 9 wherein the volumetric flow ratio of additive gas to cleaning gas is from about 1:100 to about 1:4.

16. A method according to claim 9 wherein the volumetric flow ratio of additive gas to cleaning gas is from about 1:20 to about 1:9.

17. A method according to claim 9 wherein the additive gas further comprises a fluorine-containing gas.

18. A method according to claim 9 further comprising applying a bias to the substrate.

19. A method of processing a substrate, the method comprising:
   providing a substrate having a dielectric material and an overlying resist material;
   exposing the substrate to an energized process gas comprising etchant gas to etch the dielectric material, thereby forming etchant residue on the substrate; and
   exposing the substrate to an energized process gas comprising cleaning gas and $NH_3$ to remove a majority of the etchant residue or resist material.

20. A method according to claim 19 wherein the volumetric flow rate of the cleaning gas and additive gas are selected to remove substantially all of the etchant residue deposited on the substrate during a previous process.

21. A method according to claim 19 wherein the volumetric flow rate of the cleaning gas and additive gas are selected to remove substantially all of the resist material on the substrate.

22. A method according to claim 19 wherein the cleaning gas comprises an oxygen-containing gas.

23. A method according to claim 19 wherein the cleaning gas comprises $O_2$.

24. A method according to claim 19 wherein the process gas further comprises a fluorine-containing gas.

25. A substrate cleaning method comprising:
   exposing a substrate to an energized process gas to remove residue and resist material from the substrate, the process gas comprising cleaning gas; and
   applying a bias to the substrate.

26. A method according to claim 25 comprising applying a bias of from about 75 watts to about 500 watts to the substrate.

27. A method according to claim 25 wherein the process gas further comprises an additive gas.

28. A method according to claim 27 wherein the additive gas comprises $NH_3$.

29. A method according to claim 28 wherein the additive gas further comprises a fluorine-containing gas.

30. A method according to claim 25 wherein the cleaning gas comprises an oxygen-containing gas.

31. A substrate processing method comprising:
   providing a substrate having a dielectric material and an overlying resist material, in a process chamber;
   providing an energized process gas in the process chamber, the energized process gas comprising etchant gas to etch the dielectric material, thereby forming etchant residue on the substrate and on surfaces in the chamber; and
   providing an energized process gas comprising cleaning gas in the process chamber to remove etchant residue from the surfaces in the chamber and to remove the etchant residue and resist material from the substrate.

32. A method according to claim 31 wherein the cleaning gas is introduced at a volumetric flow rate selected to remove the residue from the surfaces in the chamber and to remove most of the residue and resist material from the substrate.

33. A method according to claim 31 wherein the cleaning gas comprises an oxygen-containing gas.

34. A method according to claim 31 wherein the energized process gas further comprises an additive gas.

35. A method according to claim 34 wherein the additive gas comprises $NH_3$.

36. A met hod according to claim 35 wherein the volumetric flow ratio of $NH_3$ to cleaning gas is from about 1:100 to about 1:1.

37. A substrate cleaning method comprising:
   providing a substrate in a process chamber; and
   providing an energized process gas comprising cleaning gas and a nitrogen-containing gas to remove residue from the substrate and from the surfaces in the chamber, wherein the volumetric flow ratio of nitrogen-containing gas to cleaning gas is less than about 1:1.

38. A method according to claim 37 wherein the energized cleaning gas is introduced at a volumetric flow rate selected to remove the etchant residue from the surfaces in the chamber and to remove residue and resist material from the substrate.

39. A method according to claim 37 wherein the cleaning gas comprises an oxygen-containing gas.

40. A method according to claim 37 wherein the nitrogen-containing gas comprises $NH_3$.

41. A method according to claim 40 wherein the volumetric flow ratio of $NH_3$ to cleaning gas is from about 1:100 to about 1:1.

42. A method according to claim 37 further comprising etching the substrate in the process chamber.

43. A substrate processing method comprising:
   providing a substrate having a dielectric material and an overlying resist material, in a chamber;
   providing an energized etchant gas in the chamber to etch the dielectric material, thereby forming etchant residue; and
   providing an energized process gas to remove etchant residue and resist material from the substrate and to remove etchant residue from surfaces of the chamber, the process gas comprising cleaning gas and an additive gas comprising $NH_3$.

44. A method according to claim 43 wherein the dielectric material comprises a low K dielectric material.

45. A method according to claim 44 wherein the low K dielectric material comprises a dielectric constant less than about 3.2.

46. A method according to claim 43 wherein the cleaning gas comprises an oxygen-containing gas.

* * * * *